United States Patent
Jin

(10) Patent No.: US 7,541,648 B2
(45) Date of Patent: Jun. 2, 2009

(54) ELECTROSTATIC DISCHARGE (ESD) PROTECTION CIRCUIT

(75) Inventor: Joohyun Jin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 347 days.

(21) Appl. No.: 11/040,748

(22) Filed: Jan. 21, 2005

(65) Prior Publication Data

US 2006/0163660 A1 Jul. 27, 2006

(51) Int. Cl.
*H01L 23/58* (2006.01)
(52) U.S. Cl. .................. 257/361; 257/355; 360/323; 361/56; 361/111
(58) Field of Classification Search .............. 257/213, 257/361, 173, 355; 360/323; 361/56, 111
See application file for complete search history.

(56) References Cited

U.S. PATENT DOCUMENTS 4,994,874 A * 2/1991 Shimizu et al. ............. 257/362

(Continued)

OTHER PUBLICATIONS

Ajith Amerasekera, Transistor Operation Under ESD Conditions, ESD in Silicon Integrated Circuits, 2002, John Wiley, pp. 85-89.

(Continued)

*Primary Examiner*—Phat X Cao
*Assistant Examiner*—Abul Kalam

(74) *Attorney, Agent, or Firm*—Jones Day; Edward L. Pencoske

(57) ABSTRACT

An electrostatic discharge (ESD) protection circuit that includes a parallel connection of parasitic vertical and lateral bipolar junction transistors (BJTs) each with a floating base and a metal oxide semiconductor (MOS) field transistor with a floating body is disclosed. The three transistors may be connected in parallel between a bond (input or output) pad and a substantially fixed voltage level (e.g., a ground (or zero potential) or Vcc, depending on the transistor configuration) in a semiconductor electronic device so as to protect transistor gates or other circuit portions from damage from electrostatic voltages. The parasitic BJTs and the field transistor may be configured to remain cut off so long as an input voltage at the pad is between a negative V1 voltage (−V1) (V1>0) and a +V2 voltage (V2>Vcc), thereby allowing a greater input voltage swing without signal clamping. In one embodiment, the parasitic BJTs are PNP transistors and the field transistor is a PMOS transistor. In another embodiment, the parasitic BJTs may be NPN transistors whereas the field transistor is an NMOS transistor. The PMOS field transistor and at least the lateral PNP BJT may be configured to conduct to discharge a negative electrostatic voltage, whereas, in case of a positive electrostatic voltage, at least one of the parasitic PNP BJTs may provide a discharge path. On the other hand, an NMOS field transistor and at least one of the lateral NPN BJTs may be configured to conduct to discharge a positive electrostatic voltage, whereas, in case of a negative electrostatic voltage, at least one of the parasitic NPN BJTs may provide a discharge path. Any electronic device, including a memory device, may be configured to employ the ESD protection circuit according to the present disclosure. Because of the rules governing abstracts, this abstract should not be used to construe the claims.

22 Claims, 2 Drawing Sheets

U.S. PATENT DOCUMENTS

| | | | | |
|---|---|---|---|---|
| 5,293,057 | A * | 3/1994 | Ho et al. | 257/356 |
| 6,172,403 | B1 * | 1/2001 | Chen | 257/355 |
| 6,791,122 | B2 * | 9/2004 | Avery et al. | 257/173 |
| 6,800,906 | B2 | 10/2004 | Cheng | |
| 6,829,126 | B2 | 12/2004 | Lee et al. | |
| 6,940,104 | B2 * | 9/2005 | Yeh et al. | 257/104 |
| 7,203,050 | B2 * | 4/2007 | Cheng et al. | 361/111 |
| 7,244,992 | B2 * | 7/2007 | Ker et al. | 257/355 |
| 2004/0141266 | A1 * | 7/2004 | Ker et al. | 361/56 |

OTHER PUBLICATIONS

Charvaka Duvvury et al., Design and Layout Requirements, ESD in Silicon Integrated Circuits, 2002, Chapter 6, John Wiley, pp. 126-127.

Stanley Wolf, Silicon Processing for the VLSI era: Process Integration, Lattice Press, 1990, Chapater 6, pp. 441-443.

* cited by examiner

ELECTROSTATIC DISCHARGE (ESD) PROTECTION CIRCUIT

BACKGROUND

1. Field of the Disclosure

The present disclosure generally relates to electronic circuits and, more particularly, to an electrostatic discharge protection circuit.

2. Brief Description of Related Art

Miniaturization of electronic devices, especially the consumer electronic devices, has been a consistent trend. To meet the demands from the device users to manufacture smaller electronic devices, semiconductor manufacturers have to devise design processes that not only produce compact, yet robust, semiconductor chips to be used in the smaller electronic devices, but also to ensure that the chips are adequately protected from damage by the ever-present electrostatic discharge (ESD). It is observed that short, fast, and high-amplitude ESD pulses are an inevitable part of the day-to-day environment of both chips and the equipment (or electronic device) containing those chips. Hence, ensuring that devices provide a reasonable and acceptable level of tolerance to ESD is an important part of a device design and manufacturing program.

In an integrated circuit (e.g., a CMOS (Complementary Metal Oxide Semiconductor) IC (Integrated Circuit)), the input signals at the IC pins are generally fed to the gates of various transistors connected to relevant input pins. If the voltage applied to the gate insulator becomes excessive, the gate oxide can break down. For example, the dielectric breakdown strength of silicon dioxide (the material often used to fabricate a transistor's gate) is approximately $8 \times 10^6$ V/cm; thus, a 15 nm gate oxide (i.e., silicon dioxide) will not tolerate voltages greater than 12V without breaking down. Although this is far more than the normal operating voltage of 5V in many IC's, the electrostatic voltages can be significantly higher than the 12 V limit. If such a high voltage is accidentally applied to the pins of an IC package, its discharge (referred to as electrostatic discharge or ESD) can cause breakdown of the gate oxide of the devices to which it is applied.

Therefore, it is desirable to protect all pins of a semiconductor IC (e.g., a CMOS IC) with protective circuits (e.g., ESD protection circuits) to prevent very high electrostatic voltages from damaging MOS gates. These protective circuits are normally placed between the input (or output) pads on the chip and the transistor gates (or circuit portion) connected to the pads. FIG. 1 illustrates a prior art ESD protection circuit 10 placed between an IC pad 12 and a gate (of a transistor (not shown)) or circuit portion to which the pad 12 is connected. The circuit 10 is shown connected between a power supply voltage (Vcc) 16 and a substrate-level voltage (Vss) 18 (which may be held at a circuit ground (GND) potential during IC operation). It is seen from FIG. 1 that the ESD protection circuit 10 includes two diodes 20 (D1) and 22 (D2) connected back-to-back or in series between the Vcc and Vss terminals 16, 18, respectively. A resistor 24 is shown to represent the resistance between the pad 12 and the gate 14 terminals.

In operation, the diodes 20, 22 act as resistors when not conducting. However, when a reverse-bias input voltage (at pad 12) greater than the breakdown voltage of a diode p-n junction is applied, the device D2 (22) operates as a diode (instead of a resistor) and undergoes breakdown. Furthermore, the now-conducting diode D2 will also clamp the negative-going voltage transition at the chip input 12 to one diode drop below the substrate voltage Vss. For example, if the diode drop is 0.7V and Vss=0V, then the input signal will be clamped at −0.7V (=Vss−0.7V). Similarly, the additional protection diode (i.e., diode D1 (20) in FIG. 1) will clamp positive-going input voltage transitions to one diode drop above Vcc. For example, if Vcc =5.0V, then the input signal will be clamped by diode D1 at 5.7V (=Vcc+0.7V).

Thus, it is seen that the ESD protection circuit 10 in FIG. 1 has a shortcoming—i.e., the presence of input signal clamping by the protection diodes 20, 22. In the circuit 10 of FIG. 1, the input signal at pad 12 cannot swing beyond the range of −0.7V (negative 0.7V) to +5.7V because of the reason that if the input is greater than +5.7V, then the upper diode D1 (20) is turned on, and if the input is less than −0.7V (negative 0.7V), then the lower diode D2 (22) is activated. In practice, although the circuit 10 in FIG. 1 protects the transistor gates (or other circuit portions) from high static voltages at the input pads 12, it significantly reduces the operating swing of a non-electrostatic voltage at the input of the IC (not shown). In some applications, the input voltage (which may not be an electrostatic voltage) may itself be higher than Vcc or less than Vss (or GND), but it may not be faithfully conveyed to the circuit portion (connected to the pad 12) because of the clamping function associated with the circuit configuration 10 in FIG. 1. It is therefore desirable to devise an ESD protection circuit that can handle input signal swings greater than the Vcc or less than the circuit GND potential without being turned "on" by the input voltage outside the Vcc-GND range.

SUMMARY

The present disclosure contemplates a circuit, which comprises a first transistor having a first floating base; a second transistor having a second floating base; and a third transistor having a floating body portion, wherein each of the first, second, and third transistors is connected in parallel between a signal line and a substantially fixed voltage level, which may be a ground or a Vcc (an operating voltage for the circuit) depending on the circuit configuration. The first and second transistors may be bipolar junction transistors (BJTs) fabricated vertically and/or laterally. The BJTs may be either PNP or NPN transistors. The third transistor may be a p-channel (if the first and second transistors are PNP transistors) or an n-channel (if the first and second transistors are NPN transistors) device. The transistors may be fabricated using, for example, CMOS/BiCMOS fabrication methods. The parasitic BJTs and the PMOS (or NMOS) transistor may be configured to remain cut off so long as an input voltage to the circuit is between a negative V1 (−V1) voltage (V1>0) and a +V2 voltage (V2>Vcc), thereby allowing a greater input voltage swing without signal clamping.

In one embodiment, the present disclosure contemplates a circuit, which comprises a first vertically configured transistor having a floating base; a second horizontally configured transistor having a floating base; and a third transistor having a floating body portion, wherein each of the first, second, and third transistors is connected in parallel between a signal line and a substantially fixed voltage level. Any electronic device, including a memory device, may be configured to employ such circuit for protection from electrostatic discharge. A system employing such memory devices is also contemplated.

The present disclosure also contemplates a memory device, which comprises a memory circuit portion configured to store data therein, a plurality of electrical connectors connected to the memory circuit portion to facilitate data transfer to/from the memory circuit portion, and a plurality of ESD (electrostatic discharge) protection circuits. In the memory device at least one of the plurality of ESD protection circuits is connected between the memory circuit portion and a corresponding one of the plurality of electrical connectors. The connected ESD protection circuit includes a first transistor having a first floating base; a second transistor having a second floating base; and a third transistor having a floating body portion, wherein each of the first, second, and third transistors is connected in parallel between the corresponding one of the plurality of electrical connectors and a substantially fixed voltage level (which may be a ground or a Vcc depending on the transistor configuration). A system employing such memory devices is also contemplated. Any electronic device, including a memory device, may be configured to employ the ESD protection circuit according to the present disclosure.

In another embodiment, the present disclosure contemplates a method of operating an electrostatic discharge protection circuit. The method comprises conducting a positive electrostatic charge with one of a first transistor and a second transistor, each having a floating base; and conducting a negative electrostatic charge with a third transistor having a floating body and at least one of the first and said second transistors.

In one embodiment, the present disclosure contemplates a method of operating an electrostatic discharge protection circuit. The method comprises conducting a negative electrostatic charge with one of a first transistor and a second transistor, each having a floating base; and conducting a positive electrostatic charge with a third transistor having a floating body and at least one of the first and said second transistors.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to certain embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state electronic devices, memories or memory-based systems. It is noted at the outset that the terms "connected", "connecting," "coupled," "electrically connected," etc., are used interchangeably herein to generally refer to the condition of being electrically connected. Similarly, the term "Vcc" is used to refer to a positive operating voltage in a circuit as is known in the art, and the term "GND" is used to refer to a common circuit ground potential (which may or may not be zero) as is known in the art. Both the Vcc and GND potentials may be considered as substantially fixed voltage levels in an electronic circuit.

Figure 1:
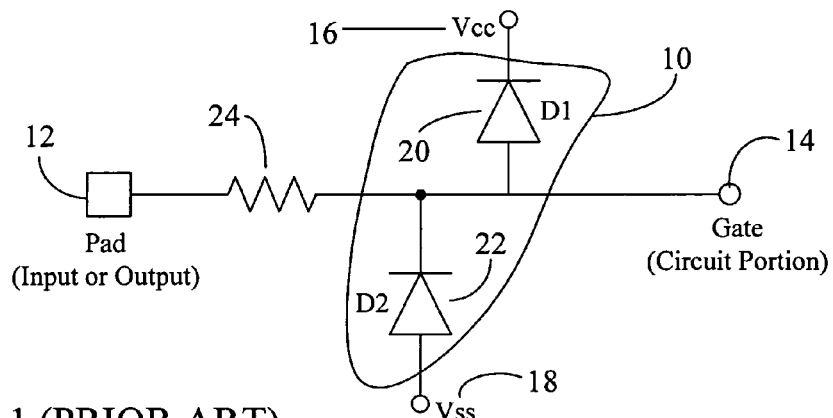
FIG. 1 illustrates a prior art ESD protection circuit placed between an IC pad and a gate or circuit portion to which the pad is connected.
Figure 2:
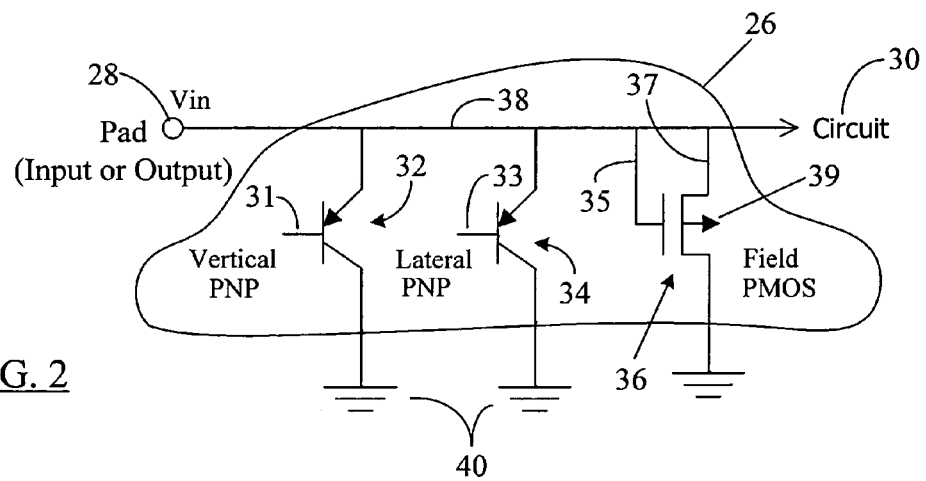
FIG. 2 shows an exemplary ESD protection circuit according to one embodiment of the present disclosure.

FIG. 2 shows an exemplary ESD protection circuit 26 according to one embodiment of the present disclosure. As in the configuration of FIG. 1, the circuit 26 is also shown placed between an IC pad (which may be an input or an output pad) 28 and a circuit portion 30 (circuit details or transistor connections not shown) to which the IC pad 28 is connected. The ESD protection circuit 26 according to one embodiment of the present disclosure includes two PNP bipolar junction transistors (BJTs) 32, 34, and a PMOS (P-channel MOS) "field" transistor 36. Each of the PNP transistors (the parasitic transistors) 32, 34 has a floating base (i.e., bases 31 and 33, respectively), whereas the Field PMOST (PMOS transistor) has a floating body (indicated by the floating bulk terminal 39) as shown in FIG. 2. The three transistors 32, 34, and 36 in the circuit 26 are connected between a signal line 38 and the circuit ground (GND) 40. The signal line 38 transfers a signal (which may be a voltage signal to be further processed or may be an electrostatic voltage transition) appearing at the IC pad 28 to the circuit component(s) 30 connected to the IC pad 28 to receive and process the signal.

As discussed hereinbefore under the "Background" section, in conventional CMOS/BiCMOS circuits, input signals (Vin) at an IC pad (e.g., the pad 12 in FIG. 1) are designed to swing between Vcc (power supply voltage) and GND potentials. In some applications, however, Vin itself may swing such that it is greater than Vcc and/or less than the GND potential. In such cases, as discussed hereinbefore with reference to FIG. 1, the conventional ESD protection circuits cannot be used because they are normally "on" when the input signal Vin reaches a certain value above Vcc or a certain value below GND. In other words, the conventional ESD protection circuits may not faithfully operate on the entire range of input voltage signals. The input signal "clamping" action present in conventional ESD protection circuits may be avoided by using the ESD protection circuit 26 according to one embodiment of the present disclosure.

Figure 3:
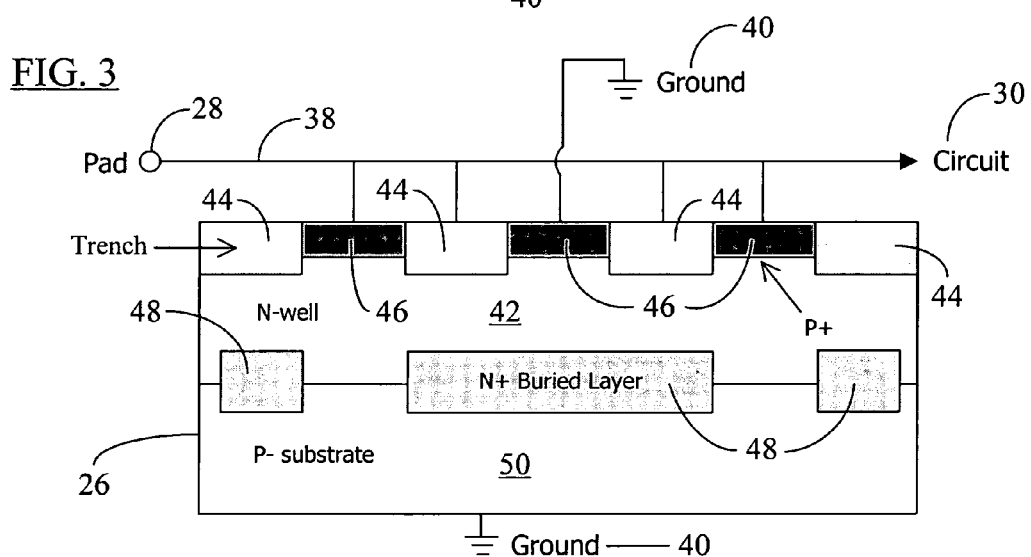
FIG. 3 depicts a simplified cross-sectional view of the ESD protection circuit in FIG. 2.

FIG. 3 depicts a simplified cross-sectional view of the ESD protection circuit 26 in FIG. 2. In the embodiment of FIG. 3, the circuit 26 is shown fabricated using fabrication methods for CMOS/BiCMOS circuits. In the embodiment of FIG. 3, the N-well 42 in the semiconductor layout of the circuit 26 is "floating," thereby resulting in an ESD protection circuit that is composed of parasitic vertical and lateral PNP BJTs (32 and 34, respectively) with an open base, and the PMOS Field transistor 36 with a floating body. All of the three transistors 32, 34, 36 are connected in parallel to the bond pad 28 as shown in FIGS. 2-3. The vertical transistor 32, as the name implies, may be configured vertically in the fabricated circuit, whereas the lateral PNP 34 may be configured horizontally in the fabricated circuit. It is seen from FIG. 3 that the cross-sectional view of the circuit 26 shows an N+ buried layer 48 sandwiched between a P-substrate 50 and the N-well 42. Multiple trenches 44 and P+ regions 46 may be fabricated on top of the N-well 42. The connections of various semiconductor regions to the signal line 38 and ground 40 are also shown in FIG. 3.

In operation, the protection circuit 26 accommodates Vin (voltage input at pad 28) voltage swings from negative V1 (−V1) (V1>0) to +V2 (>Vcc) as follows.

The Circuit 26 Under Normal Operation (i.e., without ESD)

(I) When Vin=V2

In this case, the PMOS Field Transistor 36 is obviously off. However, in case of the parasitic vertical and lateral PNP BJTs 32, 34, because the base (i.e., the N-well 42) is floating, these BJTs are also off (i.e., operating in the cut-off mode) unless the so-called Bvceo (Collector-Emitter Breakdown Voltage) of at least one of these BJTs is less than V2.

(II) When Vin=−V1 (negative V1)

In this case, the parasitic BJTs 32, 34 are off. In theory, they could work in "inverse" active mode, but the lower injection efficiency would not turn them on. For PMOS Field transistor 36, it is off unless its threshold voltage (Vth) is greater than negative V1 or −V1 (i.e., |Vth|<V1).

For example, in case Vin at pad 28 swings from −10V to +10V under Vcc=+5V, the protection circuit 26 will not be turned on if Bvceo and |Vth| are greater than 10V. In other words, so long as Bvceo>V2 and |Vth|>V1, the circuit 26 will accommodate the input voltage swing from −V1 (V1>0) to +V2 (V2>Vcc).

The Operation of the Circuit 26 Under Electrostatic Voltages (I) Positive Electrostatic Voltage In this case, the Bvceo of the parasitic BJTs 32, 34 may be designed such that it is less than the magnitude of incoming electrostatic voltage pulse but greater than the upper limit on the input voltage swing (i.e., V2<Bvceo<magnitude of electrostatic voltage). In terms of polarity, both the vertical and lateral PNP BJTs 32, 34, could be turned on by a positive electrostatic voltage, thereby discharging the positive electrostatic voltage. However, the vertical PNP 32 may be more efficient than the lateral one 34, because the vertical PNP BJT 32 can discharge the electrostatic voltage thru the entire substrate 50. Therefore, in one embodiment, it may be desirable to adjust the Bvceo of the vertical PNP device 32. For zero-order analysis, Bvceo can be expressed as:

$$Bvceo \approx \frac{Bvcbo}{\sqrt[m]{\beta}} \qquad (1)$$

where Bvcbo, "m" and "β" are Collector-Base Breakdown Voltage, empirical factor, and current gain respectively.

For most CMOS fabrication technologies, Bvcbo of N-well/P-substrate junction is typically greater than 20V. Therefore, for low voltage (about 10V) triggering, the so-called retrograde-well may be used to reduce the junction breakdown voltage (Bvcbo). An addition of an N+ buried layer 48, as shown in FIG. 3, may help to reduce Bvcbo without affecting the "β" of the vertical PNP 32. Furthermore, the lower doping at the surface in the retrograde-well may enhance the "β" of the parasitic "lateral" PNP 34, which is supposed to be activated for negative electrostatic voltages, but may be harder to turn on during negative electrostatic voltage. However, the higher doping near the base-collector junction of the vertical PNP 32 tends to reduce the "β" of vertical PNP 32. Therefore, there may be a tradeoff between Bvcbo and β of the vertical PNP 32. In one embodiment, the decrease of both substrate resistivity (which reduces Bvcbo) and N-well depth (which increases β) may be preferable for the vertical PNP 32.

(II) Negative Electrostatic Voltage

In this case, the PMOS field transistor 36 turns on first. Once the PMOS field transistor 36 is turned on, it operates in saturation mode because its gate and drain terminals 35 and 37 (FIG. 2), respectively, are tied together, but eventually the drain (P+) 46/N-well 42 junction (FIG. 3) begins to avalanche as the high voltage develops across the junction, and electron-hole pairs generated during the impact ionization activates the lateral PNP 34 (FIG. 2) to carry high negative currents, thereby discharging the negative electrostatic voltage. For this matter, in one embodiment, an NPN lateral BJT (not shown) may be employed because the NPN BJT may be more efficient in carrying high negative currents than the PNP 34, because the ionization rate for electrons is higher than that for holes.

For this positive feedback (i.e., high negative currents through impact ionization) to be maintained, it may be desirable to have a higher value of "β" for the lateral PNP 34. To obtain such β, the channel length (i.e., from P+ to P+ isolation space (not shown in FIG. 3)) may need to be reduced as much as possible. Furthermore, reduction of the well-doping (for the N-well 42 in FIG. 3) may be preferable so far as the PMOS device 36 is not turned on during the normal operation (i.e., an absence of an electrostatic voltage) of the circuit 26. In one embodiment, a circular-type layout may be employed to also increase the effective area (i.e., sidewall area of P+ junction 46 in FIG. 3). It is observed that in terms of polarity, the vertical PNP 32 is also in reverse-active mode (like the lateral PNP 34), but it will not be turned on because of its lower emitter injection efficiency.

It is noted here that although the cross-sectional schematic in FIG. 3 is based on an N-well structure for the ESD protection circuit 26, a P-well structure (not shown) with similar ESD protection functionality may also be designed by one skilled in the art. For example, in case of a P-well structure (not shown) the vertical and lateral BJTs may be NPN transistors (not shown) whereas the field transistor may be an N-channel MOS transistor (not shown). In the P-well structure, each of the NPN BJT would have a floating base, whereas the emitters of the NPN parasitic BJTs (not shown) would be connected to the signal line 38 and the collectors of the NPN BJTs would be connected to the Vcc instead of to the ground 40 as is the case for the PNP BJTs 32, 34 in the embodiment of FIG. 2. The third transistor (i.e., the N-channel field transistor (not shown)) in the P-well structure (not shown) will have a floating body and the gate and drain terminals of this N-channel field transistor would be connected to the signal line 38, however, the source of the field NMOS would be connected to the Vcc. In the P-well structure, the field NMOS along with at least one of the parasitic NPN BJTs would operate to discharge a positive electrostatic voltage, whereas at least one of the parasitic NPN BJTs may be configured to discharge a negative electrostatic voltage. It is observed that the ionization rate, which affect the current gain "β" is higher for electrons. Therefore, it may be easier to activate a parasitic NPN BJT in a floating P-well structure (not shown) than a parasitic PNP BJT (e.g., the BJTs 32, 34 in FIG. 2) in case of the floating N-well structure 26 in FIG. 3. It is also noted that the P-well structure (not shown) (with NPN BJTs and field NMOS), as briefly discussed herein, may be configured to accommodate the input voltage swing from −V1 (V1>0) to +V2 (V2>Vcc) as was the case with the N-well structure 26 in FIGS. 2-3.

Similarly, it is further noted that various breakdown and threshold voltages and their relationships discussed hereinabove with reference to the transistors 32, 34, 36 in the N-well structure 26 of FIGS. 2-3 may also apply, with appropriate modifications, to the NPN BJTs and NMOS field transistor in the P-well structure (not shown) as is evident to one skilled in the art. For example, in case of NPN BJTs and NMOS field transistor, the following relationships may apply:

$$|Bvceo|>|-V1-Vcc| \text{ (i.e., } V1+Vcc\text{), and } Vth>V2-Vcc \tag{2}$$

The reason for the modified relationships in equation (2) is that Bvceo for NPN transistors is negative and the Vth for an NMOS is positive, and the collectors of NPN transistors and the source of the NMOS field transistor are tied to Vcc in the P-well structure (not shown) as noted hereinabove.

Figure 4:
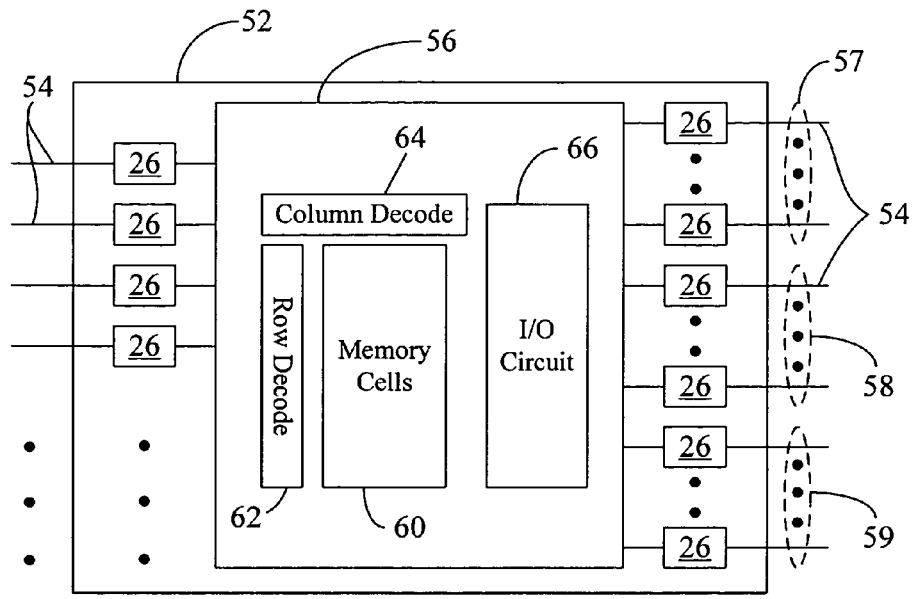
FIG. 4 is a simplified block diagram showing a memory chip that employs the ESD protection circuit configuration illustrated by way of an example in FIGS. 2-3.

FIG. 4 is a simplified block diagram showing a memory chip 52 that employs the ESD protection circuit configuration 26 illustrated by way of an example in FIGS. 2-3. It is known that memory devices are electronic devices that are widely used in many electronic products and computers to store data. A memory device is a semiconductor electronic device that includes a number of memory cells, each cell storing one bit of data. The data stored in the memory cells can be read during a read operation. The memory chip 52 in FIG. 4 may be part of a DIMM (dual in-line memory module) or a PCB (printed circuit board) containing many such memory chips (not shown in FIG. 4). The memory chip 52 may include a plurality of pins 54 located outside of chip 52 for electrically connecting the chip 52 to other system devices. Some of those pins 54 may constitute memory address pins or address bus 57, data (DQ) pins or data bus 58, and control pins or control bus 59 as shown in FIG. 4. It is evident that each of the reference numerals 57-59 designates more than one pin in the corresponding bus. Further, it is understood that the schematic in FIG. 4 is for illustration only. That is, the pin arrangement or configuration in a typical memory chip may not be in the form shown in FIG. 4.

A processor or memory controller (not shown in FIG. 4, but shown as controller 80 in FIG. 5) may communicate with the chip 52 and perform memory read/write operations. The processor and the memory chip 52 may communicate using address signals on the address lines or address bus 57, data signals on the data lines or data bus 58, and control signals (e.g., a row address select (RAS) signal, a column address select (CAS) signal, etc. (not shown)) on the control lines or control bus 59. The "width" (i.e., number of pins) of address, data and control buses may differ from one memory configuration to another.

Those of ordinary skill in the art will readily recognize that memory chip 52 of FIG. 4 is simplified to illustrate one embodiment of a memory chip and is not intended to be a detailed illustration of all of the features of a typical memory chip. Numerous peripheral devices or circuits may be typically provided along with the memory chip 52 for writing data to and reading data from the memory cells 60. However, these peripheral devices or circuits are not shown in FIG. 4 for the sake of clarity.

The memory chip 52 may include a memory circuit portion 56 connected to the pins 54 on the chip 52 via a set of ESD protection circuits 26. In the embodiment of FIG. 4, one ESD protection circuit 26 is placed at each pin 54 connecting that pin 54 to the relevant transistor gate or circuit in the memory circuit portion 56 in the manner illustrated in FIG. 2. This kind of placement of ESD protection circuits 26 may assure protection of memory chip's internal circuitry from electrostatic voltages appearing at one or more of the input or output pins 54. Additional protection (not shown) may be provided at one or more pins 54 between the ESD protection circuit 26 and the relevant transistor gate or circuit in the memory circuit portion 56. Alternatively, protection circuits other than the ESD protection circuit 26 may be placed at one or more of the pins 54 in combination with the circuits 26 placed at some other pins 54. The memory circuit portion 56 may include a plurality of memory cells 60 generally arranged in rows and columns to store data in rows and columns. A row decode circuit or row decoder 62 and a column decode circuit or column decoder 64 may select the rows and columns in the memory cells 60 in response to decoding an address provided on the address bus 57. Data to/from the memory cells 60 are then transferred over the data bus 58. A memory controller (not shown in FIG. 4, but shown as controller 80 in FIG. 5) may provide relevant control signals (not shown) on the control bus 59 to control data communication to and from the memory chip 52 via an I/O (input/output) circuit 66. The I/O circuit 66 may include a number of data output buffers or output drivers to receive the data bits from the memory cells 60 and provide those data bits or data signals to the corresponding data lines in the data bus 58.

The memory controller (not shown) may determine the modes of operation of memory chip 52. Some examples of the input signals or control signals (not shown) on the control bus 59 include an External Clock signal, a Chip Select signal, a Row Access Strobe signal, a Column Access Strobe signal, a Write Enable signal, etc. The memory chip 52 communicates to other devices connected thereto via the pins 54 on the chip 52. These pins, as mentioned before, may be connected to appropriate address, data and control lines to carry out data transfer (i.e., data transmission and reception) operations.

The memory chip 52 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. In one embodiment, the memory chip 52 is a DDR DRAM operating at a clock frequency of 667 MHz and an I/O data rate of 1334 MHz.

Figure 5:
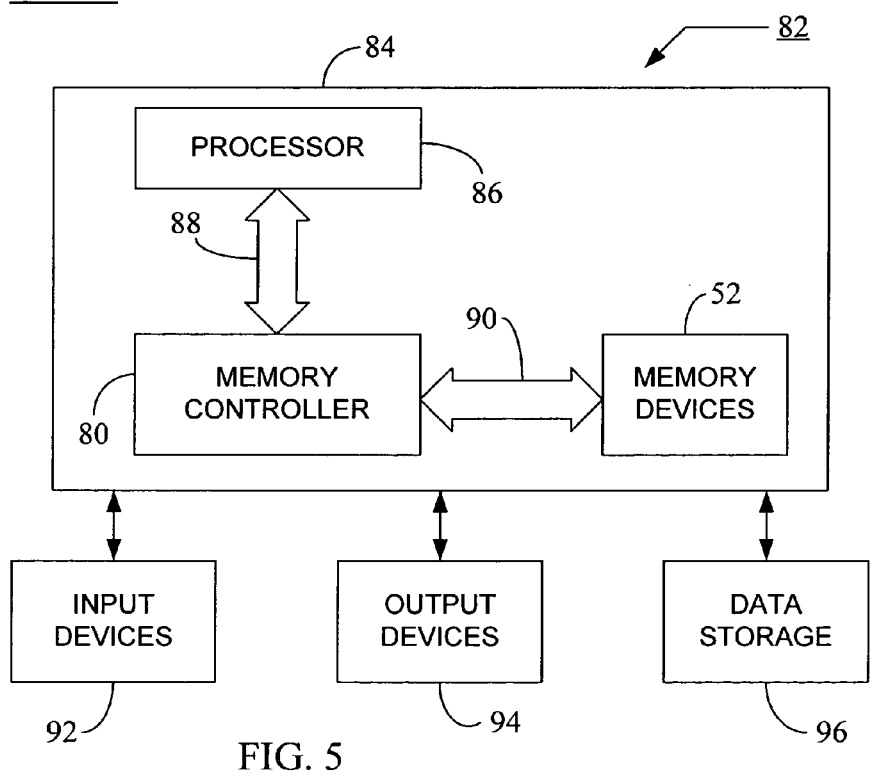
FIG. 5 is a block diagram depicting a system in which one or more memory chips illustrated in FIG. 4 may be used.

FIG. 5 is a block diagram depicting a system 82 in which one or more memory chips 52 illustrated in FIG. 4 may be used. The system 82 may include a data processing unit or computing unit 84 that includes a processor 86 for performing various computing functions, such as executing specific software to perform specific calculations or data processing tasks. The computing unit 84 also includes the memory controller 80 that is in communication with the processor 86 through a bus 88. The bus 88 may include an address bus (not shown), a data bus (not shown), and a control bus (not shown). The memory controller 80 is also in communication with a set of memory devices 52 (i.e., multiple memory chips 52 of the type shown in FIG. 4) through another bus 90, which may also include relevant address, data, and control lines similar in configuration to the lines 54 in FIG. 4. Each memory device 52 may include appropriate data storage and retrieval circuitry 56 (not shown in FIG. 5) as shown in FIG. 4. The processor 86 can perform a plurality of functions based on information and data stored in the memories 52.

In FIG. 5, the memory chips 52 are shown connected to a memory controller 80. The memory controller 80 can be a microprocessor, digital signal processor, embedded processor, micro-controller, dedicated memory test chip, a tester platform, or the like. The memory controller 80 may control routine data transfer operations to/from the memory (or memories) 52, for example, when the memory device 52 is part of an operational computing system (e.g., the system 84). The memory controller 80 may reside on the same motherboard (not shown) as that carrying the memory chips 52. Various other configurations of electrical connection between the memory chips 52 and the memory controller 80 may be possible. For example, the memory controller 80 may be a remote entity communicating with the memory chips 52 via a data transfer or communications network (e.g., a LAN (local area network) of computing devices).

The system 82 may also include one or more input devices 92 (e.g., a keyboard or a mouse) connected to the computing unit 84 to allow a user to manually input data, instructions, etc., to operate the computing unit 84. One or more output devices 94 connected to the computing unit 84 may also be provided as part of the system 82 to display or otherwise output data generated by the processor 86. Examples of output devices 94 include printers, video terminals or video display units (VDUs). In one embodiment, the system 82 further includes one or more data storage devices 96 connected to the data processing unit 84 to allow the processor 86 to store data in or retrieve data from internal or external storage media (not shown). Examples of typical data storage devices 96 include drives that accept hard and floppy disks, CD-ROMs (compact disk read-only memories), and tape cassettes. As noted before, the memory devices 52 in the computing unit 84 have the configuration illustrated in FIG. 4, i.e., each memory device 52 includes the ESD protection circuit 26 illustrated in FIGS. 2 and 3 by way of an example.

It is observed that although the discussion given hereinbefore has been primarily with reference to memory devices, it is evident that the ESD protection circuit 26 illustrated in FIGS. 2-3 may be employed, with suitable modifications (if necessary) which will be evident to one skilled in the art, in any non-memory electronic device that may utilize semiconductor circuits (including, for example, various transistor circuits) connected to various input or output pins or pads in the electronic device.

The foregoing describes an electrostatic discharge (ESD) protection circuit that includes a parallel connection of parasitic vertical and lateral bipolar junction transistors (BJTs) each with a floating base and a metal oxide semiconductor (MOS) field transistor with a floating body. The three transistors may be connected in parallel between a bond (input or output) pad and a substantially fixed voltage level (e.g., a ground (or zero potential) or Vcc, depending on the transistor configuration) in a semiconductor electronic device so as to protect transistor gates or other circuit portions from damage from electrostatic voltages. In one embodiment, the parasitic BJTs are PNP transistors and the field transistor is a PMOS transistor. In another embodiment, the parasitic BJTs may be NPN transistors whereas the field transistor is an NMOS transistor. The parasitic BJTs and the field transistor may be configured to remain cut off so long as an input voltage at the pad is between a negative V1 (−V1) voltage (V1>0) and a +V2 voltage (V2>Vcc), thereby allowing a greater input voltage swing without signal clamping. The PMOS field transistor and at least one of the PNP BJTs may be configured to conduct to discharge a negative electrostatic voltage, whereas, in case of a positive electrostatic voltage, at least one of the parasitic PNP BJTs may provide a discharge path. On the other hand, an NMOS field transistor and at least one of the lateral NPN BJTs may be configured to conduct to discharge a positive electrostatic voltage, whereas, in case of a negative electrostatic voltage, at least one of the parasitic NPN BJTs may provide a discharge path. Any electronic device, including a memory device, may be configured to employ the ESD protection circuit according to the present disclosure.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A circuit, comprising:
   a first transistor having a first floating base;
   a second transistor having a second floating base; and
   a third transistor having a floating body portion, wherein each of said first, second, and third transistors is connected between a signal line and a substantially fixed voltage level, and wherein two of said transistors are configured to be conductive when a voltage on said signal line is above a predetermined positive value and two of said transistors are configured to be conductive when a voltage on said signal line is below a predetermined negative value, and wherein said transistors are configured to be non-conductive when a voltage on said signal line is between said predetermined positive and negative values.

2. The circuit of claim 1, wherein said third transistor is a metal oxide semiconductor transistor.

3. The circuit of claim 1, wherein said first and second transistors are bipolar junction transistors and said third transistor is one of the following: a p-channel transistor and an n-channel transistor.

4. The circuit of claim 1, wherein each of said first and said second transistors is a PNP bipolar junction transistor and wherein said third transistor is a p-channel metal oxide semiconductor transistor.

5. The circuit of claim 1, wherein each of said first and said second transistors is an NPN bipolar junction transistor and wherein said third transistor is an n-channel metal oxide semiconductor transistor.

6. The circuit of claim 1, wherein said substantially fixed voltage level is a ground, and wherein an emitter of said first transistor and an emitter of said second transistor are connected to said signal line and a collector of said first transistor and a collector of said second transistor are connected to said ground, and wherein a gate and a drain of said third transistor are connected to said signal line and a source of said third transistor is connected to said ground.

7. The circuit of claim 1, wherein said substantially fixed voltage level is a power supply voltage (Vcc), and wherein an emitter of said first transistor and an emitter of said second transistor are connected to said signal line and a collector of said first transistor and a collector of said second transistor are connected to said Vcc, and wherein a gate and a drain of said third transistor are connected to said signal line and a source of said third transistor is connected to said Vcc.

8. The circuit of claim 1, wherein an operating voltage for said circuit is at a power supply (Vcc) potential, and wherein each of said first, second, and third transistors is configured to remain non-conductive so long as an input voltage on said signal line is between a negative V1 voltage (−V1) (V1>0) and a +V2 voltage (V2>Vcc).

9. The circuit of claim 8, wherein the following relationships exist: Bvceo>V2, and |Vth|>V1, wherein Bvceo is the collector-emitter breakdown voltage of each of said first and said second transistors, and Vth is the threshold voltage of said third transistor.

10. The circuit of claim 8, wherein the following relationship exists: V2<Bvceo<V3, wherein Bvceo is the collector-emitter breakdown voltage of each of said first and said second transistors, and V3 is a magnitude of a positive electrostatic voltage.

11. The circuit of claim 8, wherein the following relationships exist: $|Bvceo|>|-V1-Vcc|$, and $Vth>V2-Vcc$, wherein Bvceo is the collector-emitter breakdown voltage of each of said first and said second transistors, and Vth is the threshold voltage of said third transistor.

12. The circuit of claim 1 wherein one of said first and second transistors is oriented vertically and the other of said transistors is oriented laterally.

13. The circuit of claim 12, wherein said third transistor along with said laterally oriented transistor are configured to discharge a negative electrostatic voltage.

14. The circuit of claim 12, wherein said third transistor along with said laterally oriented transistor are configured to discharge a positive electrostatic voltage.

15. The circuit of claim 12, wherein said vertically and laterally oriented transistors are configured to discharge a positive electrostatic voltage.

16. The circuit of claim 12, wherein said vertically and laterally oriented transistors are configured to discharge a negative electrostatic voltage.

17. A circuit, comprising:
first transistor having a first floating base;
a second transistor having a second floating base; and
a third transistor having a floating body portion, wherein each of said first, second, and third transistors is connected in parallel between a signal line and a substantially fixed voltage level, and wherein said substantially fixed voltage level is a ground, and wherein an emitter of said first transistor and an emitter of said second transistor are connected to said signal line and a collector of said first transistor and a collector of said second transistor are connected to said ground, and wherein a gate and a drain of said third transistor are connected to said signal line and a source of said third transistor is connected to said ground.

18. The circuit of claim 17 wherein said first transistor is vertically formed and said second transistor is laterally formed.

19. The circuit of claim 18 wherein said laterally formed transistor is configured to be conductive when a voltage outside a normal operating range is on said signal line.

20. A circuit, comprising: a first transistor having a first floating base; a second transistor having a second floating base; and a third transistor having a floating body portion, wherein each of said first, second, and third transistors is connected in parallel between a signal line and a substantially fixed voltage level, and wherein said substantially fixed voltage level is a power supply level (Vcc), and wherein an emitter of said first transistor and an emitter of said second transistor are connected to said signal line and a collector of said first transistor and a collector of said second transistor are connected to said Vcc, and wherein a gate and a drain of said third transistor are connected to said signal line and a source of said third transistor is connected to said Vcc.

21. The circuit of claim 20 wherein said first transistor is vertically formed and said second transistor is laterally formed.

22. The circuit of claim 21 wherein said laterally formed transistor is configured to be conductive when a voltage outside a normal operating range is on said signal line.

* * * * *